United States Patent
Finnemore et al.

(10) Patent No.: US 6,514,557 B2
(45) Date of Patent: Feb. 4, 2003

(54) SYNTHESIS OF SUPERCONDUCTING MAGNESIUM DIBORIDE OBJECTS

(75) Inventors: Douglas K. Finnemore, Ames, IA (US); Paul C. Canfield, Ames, IA (US); Sergey L. Bud'ko, Ames, IA (US); Jerome E. Ostenson, Ames, IA (US); Cedomir Petrovic, Ames, IA (US); Charles E. Cunningham, Ames, IA (US); Gerard Lapertot, Grenoble (FR)

(73) Assignee: Iowa State University Research Foundation, Ames, IA (US)

( * ) Notice: Subject to any disclaimer, the term of this patent is extended or adjusted under 35 U.S.C. 154(b) by 0 days.

(21) Appl. No.: 09/939,307

(22) Filed: Aug. 24, 2001

(65) Prior Publication Data

US 2002/0111275 A1 Aug. 15, 2002

Related U.S. Application Data

(60) Provisional application No. 60/269,095, filed on Feb. 15, 2001.

(51) Int. Cl.[7] ............................. B05D 5/12; H01C 39/24
(52) U.S. Cl. .......................... 427/62; 427/117; 427/124; 427/225.24; 427/255.4; 29/599
(58) Field of Search ........................... 427/62, 117, 120, 427/124, 255.38, 355.4; 29/599

(56) References Cited

FOREIGN PATENT DOCUMENTS

| CA | 1329370 A | * | 1/2002 |
|---|---|---|---|
| RU | 2050321 C1 | * | 12/1995 |

OTHER PUBLICATIONS

Boron Isotope Effect In Superconducting $M_gB_2$, S.L. Bud'ko, G. Lapertot, C. Petrovic, C.E. Cunningham, N. Anderson and P.C. Canfield, Ames Laboratory and Department of Physics and Astronomy Iowa State University, Ames, IA, Feb. 3, 2001.

Thermodynamic and transport Properties of Superconducting $M_g{}^{10}B_2$, D.K. Finnemore, J.E. Ostenson, S.L. Bud'ko, G. Lapertot and P.C. Canfield, Ames Laboratory, U.S. Department of Energy and department of Physics and Astronomy, Iowa State University, Ames, IA, Feb. 6, 2001.

Superconductivity in Dense $M_gB_2$ Wires, P.C. Canfield, D.K. Finnemore, S.L. Bud'ko, J.E. Ostenson, G. Lapertot, C.E. Cunningham and C. Pertovic, Ames Laboratory, U.S. Department of Energy department of Physics and Astronomy, Iowa State University, Ames, IA, Feb. 12, 2001.

* cited by examiner

Primary Examiner—Brian K. Talbot
(74) Attorney, Agent, or Firm—Leydig, Voit & Mayer LTD

(57) ABSTRACT

A process to produce magnesium diboride objects from boron objects with a similar form is presented. Boron objects are reacted with magnesium vapor at a predetermined time and temperature to form magnesium diboride objects having a morphology similar to the boron object's original morphology.

18 Claims, 6 Drawing Sheets

SYNTHESIS OF SUPERCONDUCTING MAGNESIUM DIBORIDE OBJECTS

CROSS-REFERENCE TO RELATED PATENT APPLICATIONS

This patent application claims the benefit of U.S. provisional patent No. application 60/269,095, filed Feb. 15, 2001.

STATEMENT REGARDING FEDERALLY SPONSORED RESEARCH OR DEVELOPMENT

This invention was made in part with Government support under DOE Contract No. W-7405-Eng-82. The Government may have certain rights in this invention.

FIELD OF THE INVENTION

The present invention relates generally to superconductivity, and more particularly relates to a method of manufacturing superconducting magnesium diboride objects.

BACKGROUND OF THE INVENTION

The recent discovery of superconductivity in magnesium diboride ($MgB_2$) having a superconducting transition temperature ($T_c$) of approximately thirty nine degrees Kelvin (39 K) introduced a new, simple binary intermetallic superconductor having three atoms per formula unit. $MgB_2$ has a $T_c$ that is higher by almost a factor of two of any known non-oxide and non-$C_{60}$-based compound. Measurements of the boron isotope effect in $MgB_2$, which is an indication of the extent to which phonons mediate superconductivity, are consistent with the superconductivity being mediated via electron-photon coupling. Measurements of the upper critical field, $H_{c2}(T)$, the thermodynamic critical field, $H_c(T)$, and the critical current, $J_c$, indicate that $MgB_2$ is a type-II superconductor with properties that are consistent with an intermetallic superconductor that has a $T_c$ of approximately 40 K.

It is believed that $MgB_2$ forms via a process of diffusion of magnesium (Mg) vapor into boron grains. Superconducting wire, tape, and film can be used for research and applied purposes. For example, superconducting wire can be used for making superconducting magnets, fault-current limiters, and for power transmission. Films can be used to make Josephson junctions, SQUIDS (superconducting quantum interference devices), micro-electronic interconnects and other devices. The films can also be used to coat microwave cavities and other objects.

BRIEF SUMMARY OF THE INVENTION

It is an object of the instant invention to provide a method of manufacturing magnesium diboride wires, tapes, and films. It is a further object of the instant invention to provide a method of manufacturing magnesium diboride wire using boron filaments and films using boron films.

In view of the above objects, it is an object of the instant invention to provide a method of manufacturing magnesium diboride wire and films utilizing simple cost effective techniques.

In accordance with an embodiment of the instant invention, a method of manufacturing magnesium diboride wire or film comprises the steps of exposing boron filaments, tape, or film to Mg vapor for a predetermined time and temperature to form $MgB_2$ wire, tape or film, removing the formed $MgB_2$ wire, tape or film from the Mg vapor, and either quenching the $MgB_2$ wire, tape or film to near ambient temperatures or quenching the reaction vessel to near ambient temperatures and removing the $MgB_2$ wire, tape or film from the reaction vessel.

In accordance with an alternate embodiment of the instant invention, a method of manufacturing magnesium diboride wire, tape or film comprises the steps of: a) sealing at least one boron filament, tape or film and magnesium into a tantalum (Ta) or similarly inert tube with excess magnesium with respect to $MgB_2$; b) protecting the tantalum from oxidation (e.g., sealing the Ta tube in quartz); c) heating the sealed Ta tube at 950 C. for two hours or less for a boron filament diameter of 100 micrometers (with differing heating times and temperatures for differing thicknesses of boron used); d) quenching the Ta tube to room temperature and removing the formed magnesium diboride wire, tape or film from the Ta tube.

Other objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention, and together with the description serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1A:
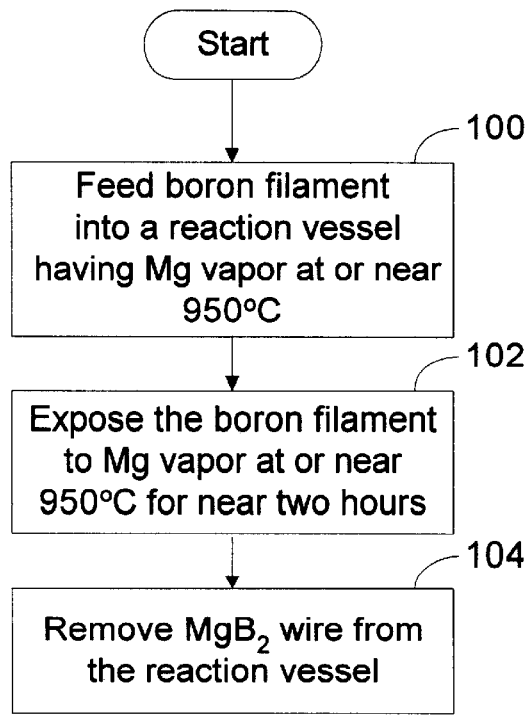
FIG. 1a is a flow diagram for illustrating a methodology for manufacturing magnesium diboride wire.

While the instant invention may be used to manufacture magnesium diboride ($MgB_2$) objects such as $MgB_2$ wire, tape, and film, the instant invention will be described using MgB$_2$ wire. Those skilled in the art will recognize that the process used to make the MgB$_2$ wire can also be used to make MgB$_2$ film, tape or any other form or structure by turning boron having a similar morphology (i.e., form) into MgB$_2$ via exposure to magnesium vapor. For example, boron coatings on cavities or other devices could be turned into MgB$_2$ coatings. Turning now to FIG. 1a, the steps to manufacture magnesium diboride (MgB$_2$) wire are shown. Boron filaments are fed into a reaction chamber or vessel (step 100). The boron filaments may be continually fed into the reaction vessel or pre-cut to a specified length. The boron filaments are exposed to Mg vapor in the reaction vessel for a predetermined time and temperature to form MgB$_2$ wire (step 102). The vapor pressure is determined by the reaction vessel temperature using well established vapor pressure versus temperature curves as known in the art. The minimum exposure time increases with increasing filament diameter and decreases with increasing temperature. For example, a 100 micrometer diameter boron filament that is exposed to Mg vapor heated to or near 950 C. for approximately two hours forms MgB$_2$ wire. A 140, 200, or 300 micrometer diameter filament must be heated longer than two hours for the transformation to be completed. The 140 and 200 micrometer diameter filaments form wire when exposed to Mg vapor heated to or near 950 C. for near 6 hours and the 300 micrometer diameter filaments form wire when exposed to Mg vapor heated to or near 950 C. for near 15 hours. During the heating step, MgB$_2$ wire is formed as a result of the reaction between the boron filaments and the Mg vapor. After the MgB$_2$ wire has been formed, the MgB$_2$ wire is removed from the reaction vessel (step 104). The MgB$_2$ wire is quenched to near ambient temperatures or is cooled at a predetermined ramp rate.

The same process is used for other boron objects. For example, MgB$_2$ films are created by depositing boron film on a substrate inert to the Mg vapor such as strontium titanate. The film is deposited using pulsed laser deposition or other known methods of deposition. Once the boron film is deposited on the substrate, the film is placed or fed into a reaction vessel and exposed to Mg vapor for a predetermined time and temperature. For example, a one micrometer thick boron film that is exposed to Mg vapor heated to or near 950 C. for approximately a half hour forms MgB$_2$ film. After the MgB$_2$ film is formed, the film is removed from the reaction vessel and either quenched to near ambient temperature or is cooled at a predetermined ramp rate.

Figure 1B:
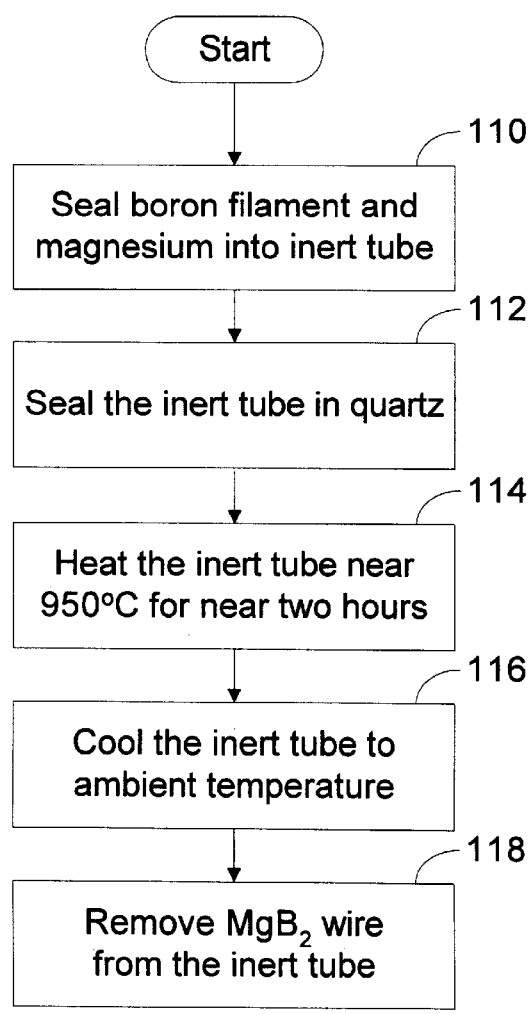
FIG. 1b is a flow diagram for illustrating an alternate methodology for manufacturing magnesium diboride wire.

Turning now to FIG. 1b, the steps to manufacture magnesium diboride (MgB$_2$) wire using an alternate embodiment are shown. Boron filaments and magnesium are placed into a tantalum (Ta) or other inert tube such as niobium, molybdenum, tungsten, and possibly iron and some steels (step 110). The nominal ratio of magnesium to boride in the Ta tube is Mg$_2$B. While a nominal ratio of Mg$_2$B was used, those skilled in the art will recognize that other ratios may be used provided that there is excess magnesium with respect to MgB$_2$ (i.e., the ratio of Mg:B is greater than 1:2). The Ta tube is then sealed in quartz or an equivalent material to protect the Ta from oxidation at elevated temperatures (step 112). Those skilled in the art will recognize that other methods of providing such protection can be used. The sealed Ta tube is placed in a box furnace at a temperature of 950 C. for approximately two hours (step 114). The Ta tube is then removed and cooled to room temperature (step 116). MgB$_2$ wire forms during the temperature soak at 950 C. and the wire is removed when the Ta tube is near room ambient temperature (step 118).

Figure 2A:
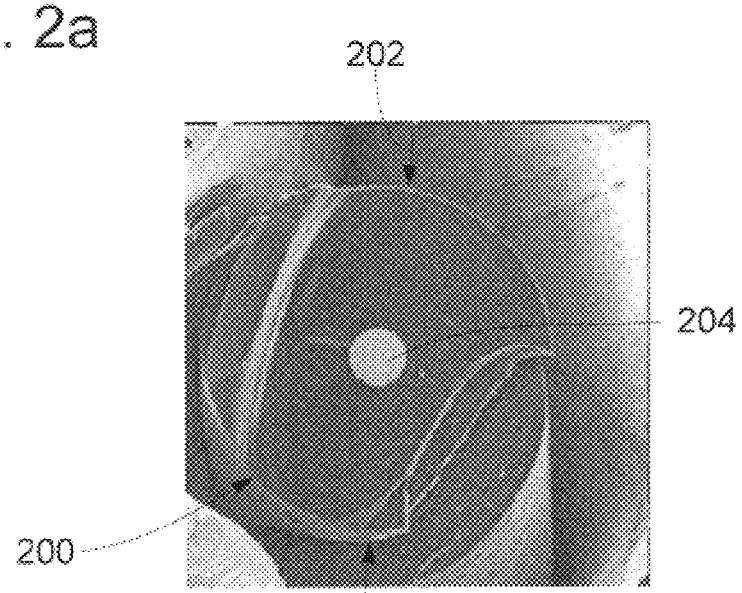
FIG. 2a is a cross-sectional view of a boron filament used in the manufacturing of magnesium diboride wire.
Figure 2B:
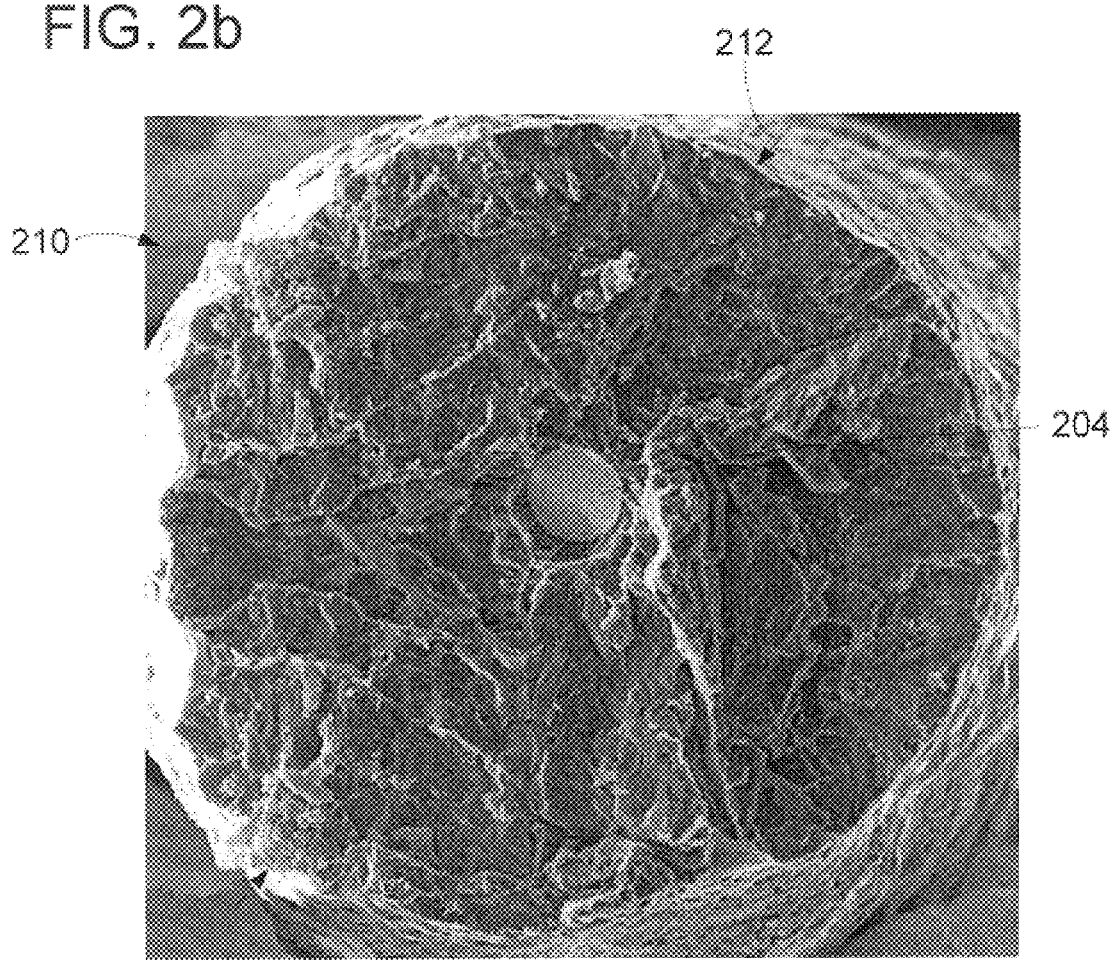
FIG. 2b is a cross-sectional view of magnesium diboride wire made in accordance with the teachings of the instant invention.

Now that the manufacturing processes have been described, the characteristics of the MgB$_2$ wire formed will now be described. Turning now to FIGS. 2a and 2b, the boron filament 200 and MgB$_2$ wire 210 are shown. In FIG. 2a, a cross-section of a boron filament 200 is shown. The boron filament diameter 202 is 100 $\mu$m and it has a tungsten/tungsten boride core 204 having a diameter of approximately 15 $\mu$m. The tungsten/tungsten boride core 204 is part of the boron filament 200 and does not appear to be effected by the exposure of the boron filament 200 to magnesium. As discussed hereinbelow, the tungsten/tungsten boride core 204 does not seem to effect the superconducting properties of the resulting MgB$_2$ wire. While a 100 $\mu$m diameter filament was used, it should be recognized that other diameters and boron tapes may be used with appropriate changes in temperature and time of exposure to Mg vapor. FIG. 2b shows a cross-section of MgB$_2$ wire 210 produced after steps 100–104 or 110–118 are taken. In FIG. 2b, the MgB$_2$ wire 210 has a diameter 212 of approximately 160 $\mu$m. The increased diameter of the MgB$_2$ wire 210 is consistent with observations that there is an expansion associated with the formation of MgB$_2$ powders during synthesis.

Figure 3:
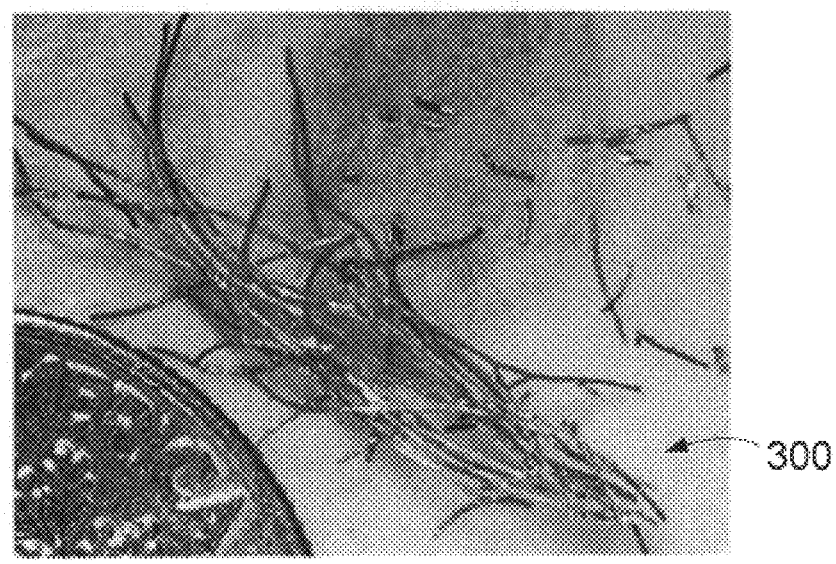
FIG. 3 is an image of magnesium diboride wires made in accordance with the teachings of the instant invention.

FIG. 3 shows an image of the resulting MgB$_2$ wire segments 300. As can be seen, there has been significant warping and bending of the boron filament 200 as a result of the reaction with the magnesium vapor at high temperature. Although the MgB$_2$ wire segments 300 are somewhat brittle, the integrity of the filament segments is preserved during the exposure to the Mg vapor (i.e. the boron filaments 200 do not decompose or turn into powder). The MgB$_2$ wire may be encased in a sleeve to increase mechanical stability of the MgB$_2$ wire.

Based upon a diameter 212 of 160 $\mu$m and measuring the length and mass of several MgB$_2$ wire segments 300, the density of the wire is determined to be approximately 2.4 g/cm$^3$. This is to be compared with a theoretical value of 2.55 g/cm$^3$ for a single crystal sample using lattice parameters a =3.14 Å and c =3.52 Å for the hexagonal unit cell. This implies that the MgB$_2$ wire segments 300 are probably better than approximately 90% of the theoretical density. It should be noted that the small tungsten/tungsten boride core would come in as a roughly 10% correction, and therefore is within the level of uncertainty.

Figure 4:
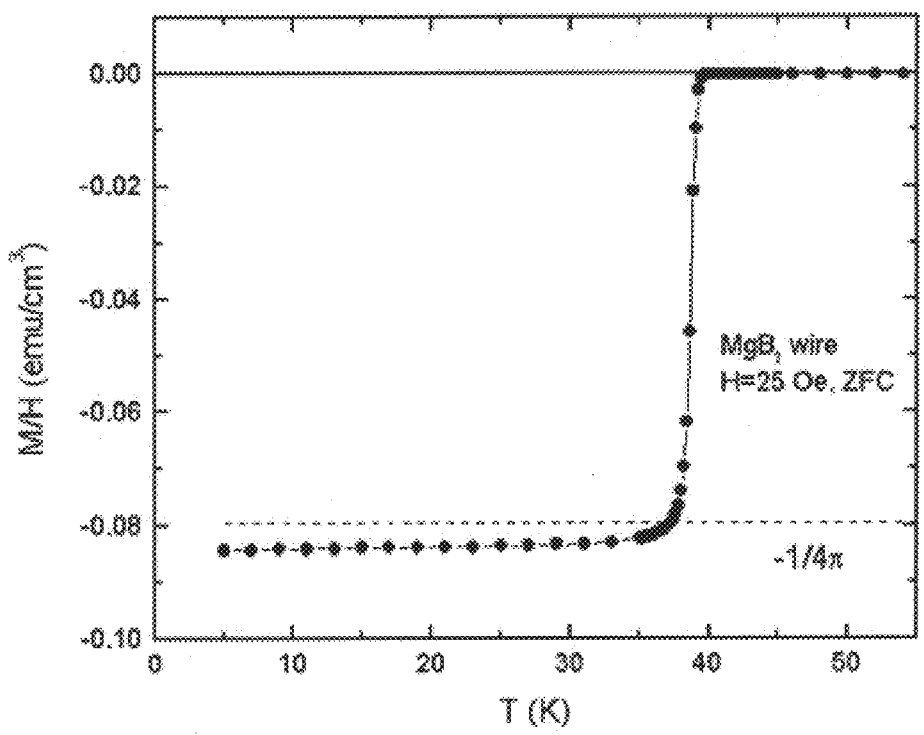
FIG. 4 is a graphic illustration of the magnetization divided by an applied magnetic field of 25 Oe for a zero field cooled magnesium diboride wire made in accordance with the teachings of the instant invention.

Turning now to FIG. 4, the temperature-dependent magnetization of MgB$_2$ wire is shown. The data were taken after the MgB$_2$ wire segments 300 were cooled in a zero magnetic field and then warmed in a field of 25 Oe (Oersteds). Taking into account the aspect ratio of the MgB$_2$ wire segments, a susceptibility very close to a value of $-1/4\pi$, which is the value expected for total shielding and a demagnetization factor close to zero, was obtained. The superconducting transition temperature (T$_c$) of 39.4 K is determined from these data by using an onset criterion (2% of $-1/4\pi$). The width of the temperature transition (10%–90%) is 0.9 K.

Figure 5:
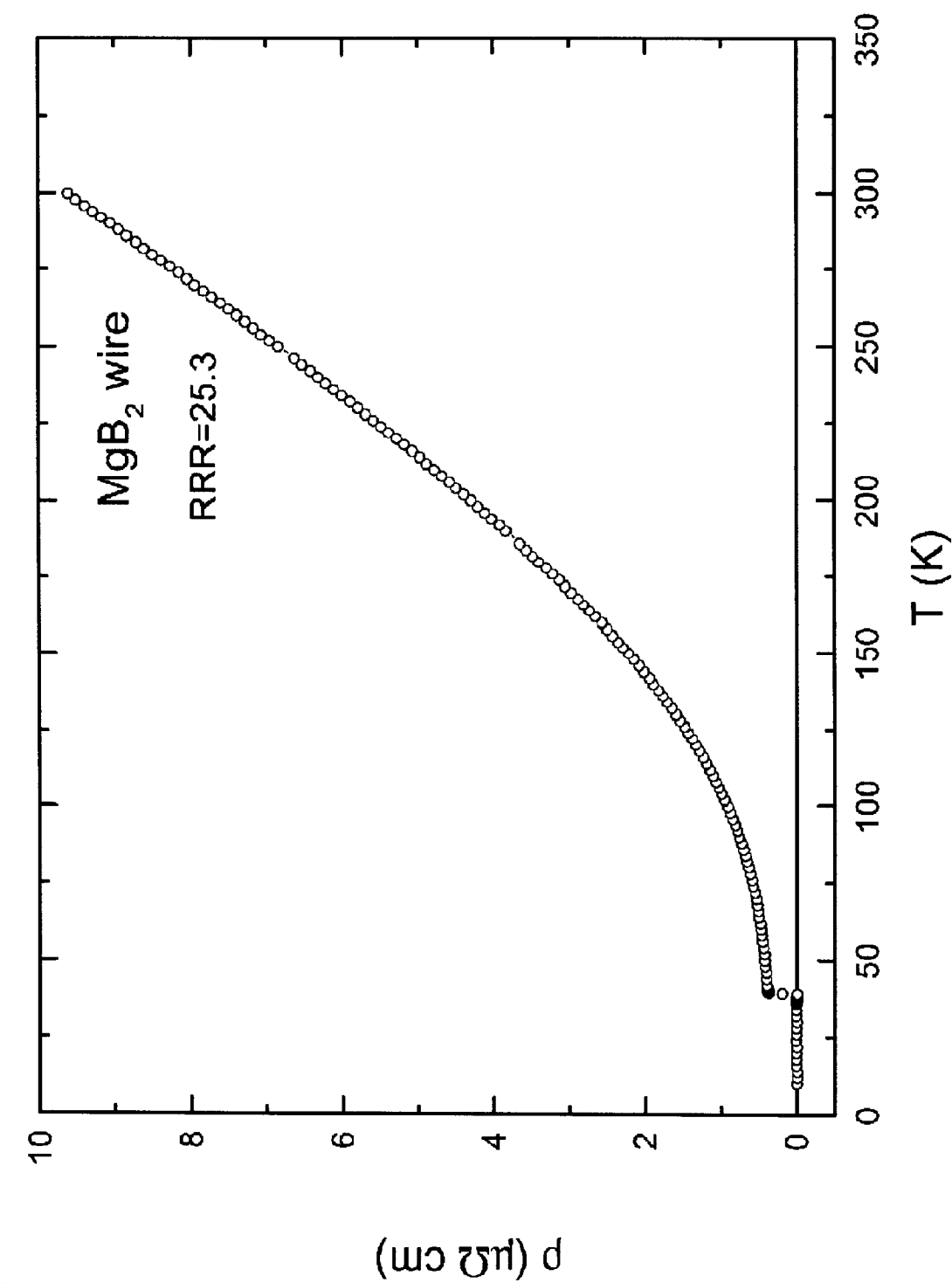
FIG. 5 is a graphical plot illustrating the relationship between the electrical resistivity of magnesium diboride wire and temperature.

Turning now to FIG. 5, the temperature-dependent electrical resistivity of MgB$_2$ wire segments 300 formed by the process of the present invention is shown. The resistivity, $\rho$, at room temperature has a value of 9.6 $\mu$Ohm-cm whereas $\rho$ at 77 Kelvin has a value of 0.6 $\mu$Ohm-cm and $\rho$ at 40 Kelvin has a value of 0.38 $\mu$Ohm-cm. This leads to a residual resistivity ratio of RRR equal to 25.3. The resistivity for temperatures just above T$_c$ is lower by a factor of ten to twenty over existing superconducting materials such as Nb$_3$Sn. This means that the MgB$_2$ wire may manifest less need to be encased in a relatively higher conducting sleeve (such as copper) as required by materials such as Nb$_3$Sn to keep wire resistance down in the event that temperature rises above the superconducting transition temperature of the material being used. It should be noted that the shape of the resistivity curve and the RRR values are qualitatively the same as the shape and RRR values observed for sintered pellets of polycrystalline $Mg^{10}B_2$. The resistivity of the sintered pellet samples of polycrystalline $Mg^{10}B_2$ is approximately 1 $\mu$Ohm-cm at 40 K. This somewhat higher value of the calculated resistivity for the sintered pellet samples of polycrystalline $Mg^{10}B_2$ is consistent with the sintered pellet sample having an actual density substantially lower than either the $MgB_2$ wire or the theoretical value.

The temperature-dependent resistivity shown in FIG. 5 can be fit by a power law of $\rho=\rho_0+\rho_1 T^\alpha$ with $\alpha$ approximately equal to 2.6 between the superconducting critical temperature, $T_c$ and 200 Kelvin. This is comparable to the power law $R=R_1+R_1 T^{\alpha_1}$, with $\alpha_1$ approximately equal to 2.8, found for the sintered $Mg^{10}B_2$ pellet samples over a comparable temperature range. Due to the similarity of the two power laws, those skilled in the art will recognize that that the resistivity of $MgB_2$ will not have a linear slope for temperatures between $T_c$ and 300 Kelvin. On the other hand, using an average Fermi velocity of $v_F=4.8 \cdot 10^7$ cm/s and a carrier density of $6.7 \cdot 10^{22}$ el/cm$^3$ (two free electrons per unit cell) the electronic mean free path is estimated to be approximately 600 Å at $T_c$. This is clearly an approximate value of the electronic mean free path, but with an estimated superconducting coherence length of approximately 50 Å, these values place $MgB_2$ wire segments 300 well within the clean limit, which those skilled in the art will recognize as a indication of high sample quality. This indicates that superconducting properties such as the upper critical field and critical current may be improved by the judicious addition of impurities.

Figure 6:
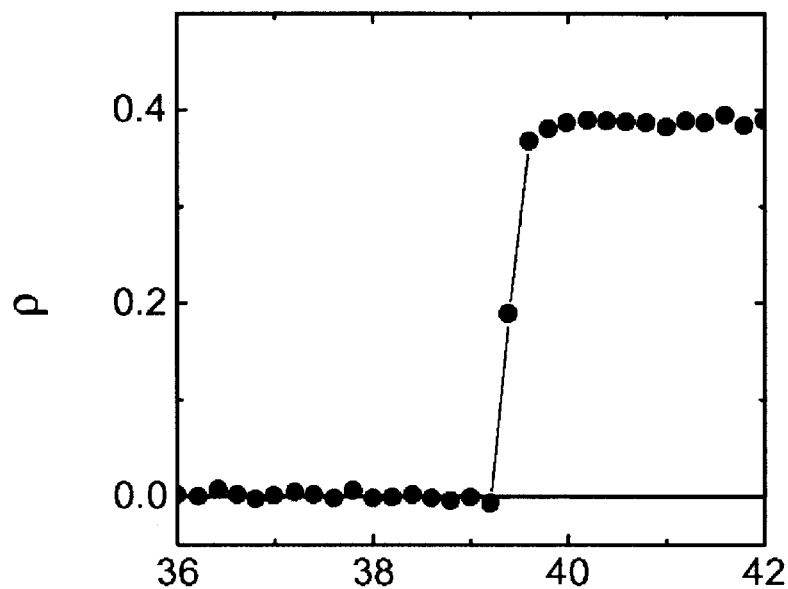
FIG. 6 is an expanded view of the resistivity data of FIG. 5 near the superconducting transition temperature.

The superconducting transition temperature, $T_c$=39.4 K, can be determined from both the magnetization and resistivity data shown in FIGS. 4 and 5. This value is slightly higher than the $T_c$=39.2 K value determined for isotopically pure $Mg^{11}B_2$, but is significantly lower that $T_c$=40.2 K for $Mg^{10}B_2$. The value is consistent with an approximate 80% natural abundance of $^{11}B$. It should be noted that the superconducting transition is both relatively high and sharp in the $MgB_2$ wire segments 300. This means that either very few impurities are being incorporated into the $MgB_2$ wire segments 300 or that what few impurities are being incorporated are having very little effect on either resistivity or $T_c$. FIG. 6 shows an expanded view of the temperature-dependent resistivity data of FIG. 5 near the superconducting transition temperature $T_c$.

Figure 7:
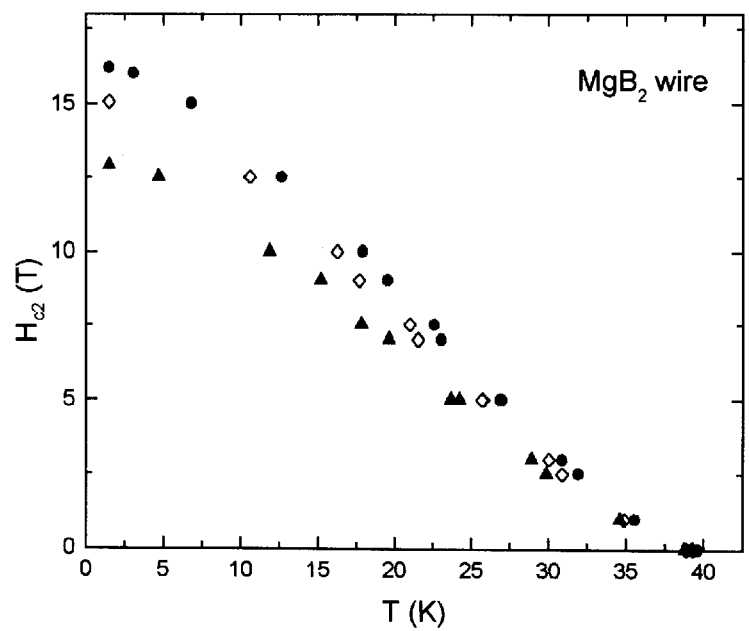
FIG. 7 is a graphic illustration of $H_{c2}(T)$ data inferred from the resistivity data similar to that shown in FIG. 5.

The temperature dependence of the upper critical field, $H_{c2}(T)$, is illustrated in FIG. 7. For each field, three data points are shown. The three data points are onset temperature, temperature for maximum d$\rho$/dT, and completion temperature. Qualitatively these data are similar to the $H_{c2}(T)$ data inferred from measurements on $Mg^{10}B_2$ sintered pellets. Quantitatively, at an H of 9 T, the width of the resistive transition for a $MgB_2$ wire segments 300 is roughly half of the width found for the sintered $Mg^{10}B_2$ pellet samples. These data are consistent with the wire sample being of comparable or better quality as the sintered pellet samples.

Figure 8:
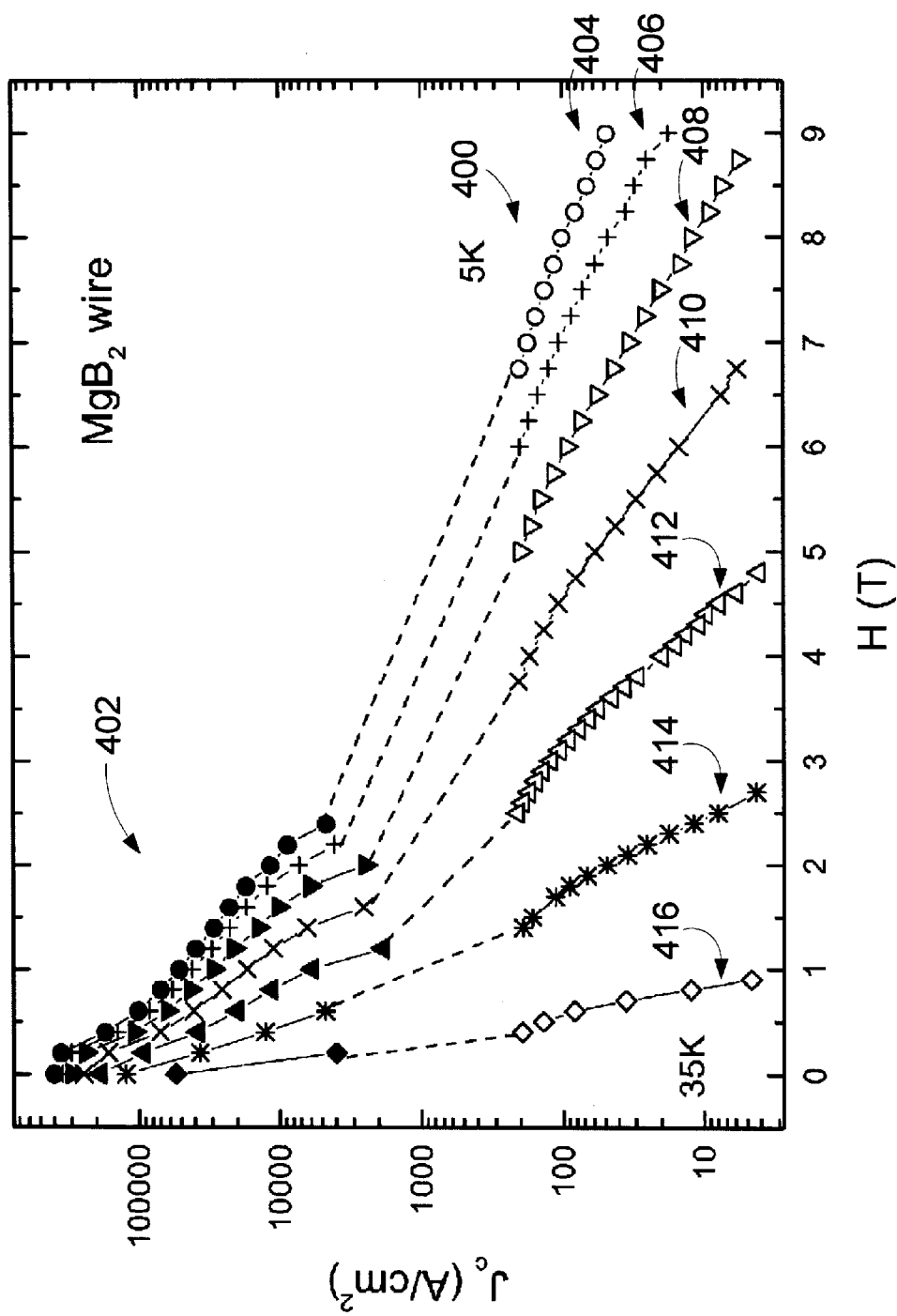
FIG. 8 is a graphic illustration of the superconducting critical current density as a function of an applied field for temperatures ranging from 5 K to 35 K in increments of 5 K.

Turning now to FIG. 8, data on the critical current $J_c$ is shown. The open symbols, represented generally as 400, are $J_c$ values extracted from direct measurements of the current dependent voltage across the $MgB_2$ wire segment 300 at given temperature and applied field values. The filled symbols, represented generally as 402, are $J_c$ values inferred from magnetization loops by application of the Bean model. The temperature values are incremented every 5 K and range from 5 K to 35 K. 5 K measurements and extrapolations are generally illustrated at line 404, 10 K measurements and extrapolations are generally illustrated at line 406, 15 K measurements and extrapolations are generally illustrated at line 408, 20 K measurements and extrapolations are generally illustrated at line 410, 25 K measurements and extrapolations are generally illustrated at line 412, 30 K measurements and extrapolations are generally illustrated at line 414, and 35 K measurements and extrapolations are generally illustrated at line 416. The dashed lines connect data sets taken at the same temperature. The direct measurement of $J_c$ was limited to values below approximately 200 A/cm$^2$ due to resistive heating from the leads attached to the $MgB_2$ wire segment 300 and contact resistance. As can be seen, the extrapolations of the directly measured, low $J_c$, data and the Bean-model-inferred, high $J_C$, data match up moderately well. In comparison to the $J_c$ data for a sintered pellet of $Mg^{10}B_2$, $J_c$ for the $MgB_2$ wire segment 300 is roughly a factor of two higher at low fields and temperatures and over an order of magnitude higher at high fields.

A simple technique of producing low resistivity, high density, high $T_c$ $MgB_2$ in wire, tape, or film form via exposure of boron filaments, tape, or film to Mg vapor has been presented. The resulting $MgB_2$ wire has approximately 90% the theoretical density of $MgB_2$ and measurements of the temperature dependent resistivity reveal that $MgB_2$ is highly conducting in the normal state. The room temperature resistivity has a value of 9.6 $\mu$Ohm-cm whereas the resistivity at a temperature of 40 K is 0.38 $\mu$Ohm-cm. This means that even in the normal state, $MgB_2$ wires can carry significant current densities. This should be compared with the resistivity of $Nb_3Sn$, which has a resistivity value of 11 $\mu$Ohm-cm at a temperature of 20 K and a resistivity value of 80 $\mu$Ohm-cm at a temperature of 300 K.

The $MgB_2$ wires can be used for both research and applied purposes. Examples include, but are not limited to, superconducting magnets, power transmission lines, fault-current limiters, and micro-electronic circuits (e.g. SQUIDS or interconnects). It should be noted that boron filaments and tapes are produced in a variety of sizes and of arbitrary lengths and that different applications may require different sizes of $MgB_2$ wires or tapes. The conversion of boron filaments or tapes into $MgB_2$ wire or tapes as part of a continuous process leads to the possibility of simple manufacturing of light weight, high $T_c$, wires or tapes with remarkably small normal state resistivities. Additionally, the process used in creating the $MgB_2$ wire or tape can be used to turn boron coatings on cavities or other devices into high-quality superconducting films.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for producing a magnesium diboride object comprising the step of reacting a boron object with magnesium vapor at a predetermined time and temperature to form the magnesium diboride object.

2. The method of claim 1 wherein the magnesium vapor is enclosed in a reaction vessel, the method further comprising the steps of:

feeding the boron object into the reaction vessel;

removing the formed magnesium diboride object from the reaction vessel; and cooling the magnesium diboride object at a predetermined rate.

3. The method of claim 1 wherein the boron object is boron film, the method further comprising the step of depositing the boron film on a substrate inert to the magnesium vapor.

4. The method of claim 1 wherein the boron object is a boron filament and wherein the step of reacting the boron object with the magnesium vapor at a predetermined time and temperature comprises the step of reacting the boron filament at a predetermined time and temperature.

5. The method of claim 4 wherein the boron filament has a diameter of less than approximately one hundred micrometers and wherein the step of reacting the boron filament at a predetermined time and temperature comprises the step of reacting the boron filament at a temperature of approximately 950 C. for a time of approximately two hours to form magnesium diboride wire.

6. The method of claim 4 wherein the boron filament has a diameter between approximately one hundred forty micrometers and two hundred micrometers and wherein the step of reacting the boron filament at a predetermined time and temperature comprises the step of reacting the boron filament at a temperature of approximately 950 C. for a time of less than approximately six hours to form magnesium diboride wire.

7. The method of claim 4 wherein the boron filament has a diameter of approximately three hundred micrometers and wherein the step of reacting the boron filament at a predetermined time and temperature comprises the step of reacting the boron filament at a temperature of approximately 950 C. for a time of less than approximately fifteen hours to form magnesium diboride wire.

8. The method of claim 5 further comprising the step of encasing the magnesium diboride wire in a conductive sleeve.

9. A method for producing a magnesium diboride object comprising the steps of:

feeding the boron object into a reaction vessel having magnesium vapor within the reaction vessel;

reacting the boron object with the magnesium vapor for a predetermined time at a predetermined temperature;

removing the formed magnesium diboride object from the reaction vessel; and cooling the magnesium diboride object at a predetermined rate.

10. The method of claim 9 wherein the boron object is boron film, the method further comprising the step of depositing the boron film on a substrate inert to the magnesium vapor.

11. The method of claim 10 wherein the boron film has a thickness of approximately one micrometer and the step of reacting the boron object with the magnesium vapor for a predetermined time at a predetermined temperature comprises the step of reacting the born film at a temperature of approximately 950 C. for a time of approximately one half hour.

12. The method of claim 9 wherein the boron object is a boron filament and wherein the step of reacting the boron object with the magnesium vapor at a predetermined time and temperature comprises the step of reacting the boron filament at a predetermined time and temperature.

13. The method of claim 12 wherein the boron filament has a diameter of less than approximately one hundred micrometers and wherein the step of reacting the boron filament at a predetermined time and temperature comprises the step of reacting the boron filament at a temperature of approximately 950 C. for a time of approximately two hours to form magnesium diboride wire.

14. The method of claim 12 wherein the boron filament has a diameter of between one hundred forty and two hundred micrometers and wherein the step of reacting the boron filament at a predetermined time and temperature comprises the step of reacting the boron filament at a temperature of approximately 950 C. for a time of less than approximately six hours to form magnesium diboride wire.

15. The method of claim 12 wherein the boron filament has a diameter of less than approximately three hundred micrometers and wherein the step of reacting the boron filament at a predetermined time and temperature comprises the step of reacting the boron filament at a temperature of approximately 950 C. for a time of less than approximately fifteen hours to form magnesium diboride wire.

16. A method for producing a magnesium diboride object comprising the steps of:

putting a boron object and magnesium into an inert tube;

heating the inert tube to a predetermined temperature for a predetermined time to form the magnesium diboride object;

cooling the magnesium diboride object at a predetermined rate; and removing the formed magnesium diboride object from the inert tube.

17. The method of claim 16, wherein the magnesium diboride object is one of wire, tape, and film and wherein the step of heating the inert tube to a predetermined temperature for a predetermined time to form the magnesium diboride object comprises the step of heating the inert tube to approximately 950 C. for a predetermined time to form the magnesium diboride object.

18. The method of claim 17, wherein the one of wire, tape, and film has a diameter or thickness, and wherein the step of heating the inert tube to approximately 950 C. for a predetermined time to form the magnesium diboride object comprises the step of heating the inert tube to approximately 950 C. for one of approximately one half hour for a diameter or thickness of one micrometer, approximately two hours for a diameter or thickness of one hundred micrometers, less than approximately six hours for a diameter or thickness of one hundred forty to two hundred micrometers, and less than fifteen hours for a diameter or thickness of three hundred micrometers to form the magnesium diboride object.

* * * * *

UNITED STATES PATENT AND TRADEMARK OFFICE
CERTIFICATE OF CORRECTION

PATENT NO. : 6,514,557 B2  Page 1 of 1
DATED : February 4, 2003
INVENTOR(S) : Douglas K. Finnemore et al.

It is certified that error appears in the above-identified patent and that said Letters Patent is hereby corrected as shown below:

Column 8,
Line 2, change "born" to -- boron --.

Signed and Sealed this

Sixteenth Day of March, 2004

JON W. DUDAS
*Acting Director of the United States Patent and Trademark Office*